(12) United States Patent
Jung et al.

(10) Patent No.: US 8,211,744 B2
(45) Date of Patent: Jul. 3, 2012

(54) METHODS OF FORMING NANO STRUCTURE AND METHODS OF FORMING SOLAR CELL USING THE SAME

(75) Inventors: Mi Hee Jung, Daejeon (KR); Hogyeong Yun, Seoul (KR); Mangu Kang, Daejeon (KR); Sanghee Kim, Daejeon (KR); Hunkyun Pak, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 20 days.

(21) Appl. No.: 12/828,084

(22) Filed: Jun. 30, 2010

(65) Prior Publication Data
US 2011/0124148 A1   May 26, 2011

(30) Foreign Application Priority Data

Nov. 20, 2009  (KR) ............... 10-2009-0112665
Jan. 21, 2010  (KR) ............... 10-2010-0005615

(51) Int. Cl.
*H01L 21/00* (2006.01)
*H01L 21/16* (2006.01)
(52) U.S. Cl. ........ 438/104; 438/622; 438/623; 438/624; 257/700; 977/700
(58) Field of Classification Search ............ 438/85, 438/104, 48, 614, 622, 623, 624, 625, 618; 257/750, 751, 700; 977/700
See application file for complete search history.

(56) References Cited

U.S. PATENT DOCUMENTS

| 7,563,457 B2 | 7/2009 | Cha et al. | |
| 2006/0147616 A1* | 7/2006 | Gaudiana et al. | 427/74 |
| 2007/0105321 A1* | 5/2007 | Lee et al. | 438/270 |
| 2007/0122927 A1* | 5/2007 | Li et al. | 438/48 |

FOREIGN PATENT DOCUMENTS

| EP | 0891947 A1 | 1/1999 |
| KR | 2009-0065177 A | 6/2009 |

OTHER PUBLICATIONS

Tammy P. Chou, et al., "Hierarchically Structured ZnO Film for Dye-Sensitized Solar Cells with Enhanced Energy Conversion Efficiency", Advanced Materials, 2007, vol. 19, pp. 2588-2592.
Qifeng Zhang, et al., "Aggregation of ZnO Nanocrystallites for High Conversion Efficiency in Dye-Sensitized Solar Cells", Angewandte Chemie International Edition, 2008, vol. 47, pp. 2402-2406.
Eun Sik Kwak, et al., "Compact Inverse-Opal Electrode Using Non-Aggregated $TiO_2$ Nanoparticles for Dye-Sensitized Solar Cells", Advanced Functional Materials, 2009, vol. 19, pp. 1093-1099.

(Continued)

*Primary Examiner* — Ha Tran T Nguyen
*Assistant Examiner* — Thanh Y Tran
(74) *Attorney, Agent, or Firm* — Rabin & Berdo, P.C.

(57) ABSTRACT

Provided are methods of forming a nano structure and method of forming a solar cell using the same. The method of forming the nano structure includes: preparing a template; ionizing a surface of the template; forming an oxide layer enclosing the template on the surface of the template; and removing the template.

8 Claims, 4 Drawing Sheets

OTHER PUBLICATIONS

Qifeng Zhang, et al., "Polydisperse Aggregates of ZnO Nanocrystallites: A Method for Energy-Conversion-Efficiency Enhancement in Dye-Sensitized Solar Cells", Advanced Functional Materials, 2008, vol. 18, pp. 1654-1660.

Mi-Hee Jung, et al., "ZnO Nanosphere Fabrication using the Functionalized Polystyrene Nanoparticles for Dye-Sensitized Solar Cells", Electrochimica Acta, In Press, Accepted Manuscript, Elsevier B.V., Article No. 15916, 2010, pp. 1-7.

* cited by examiner

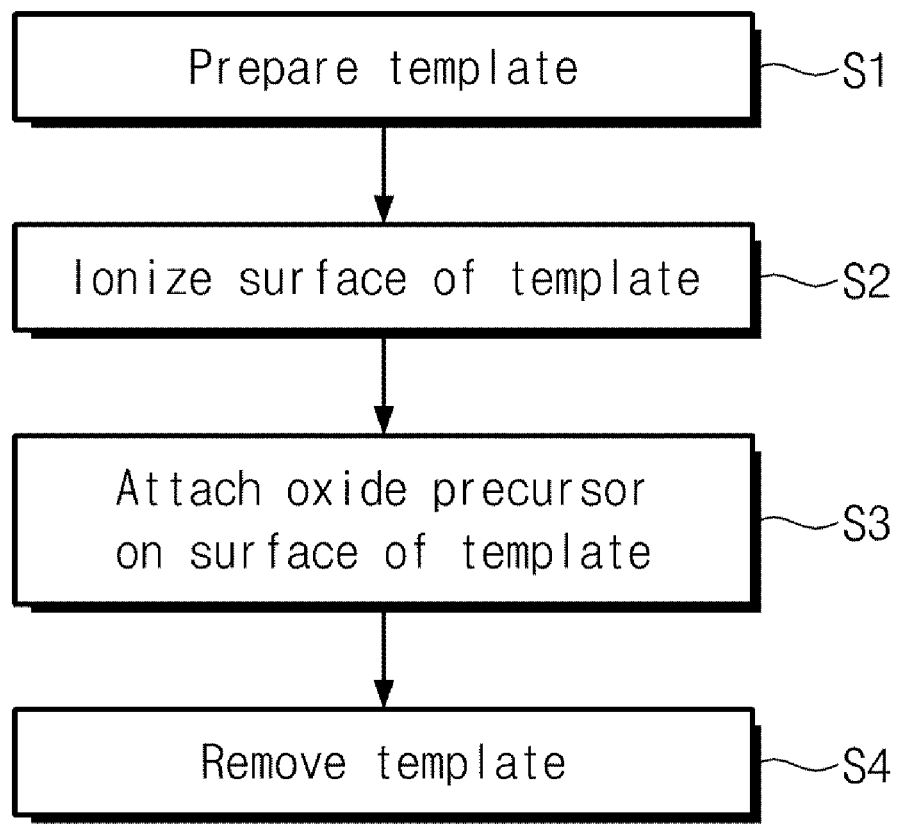

METHODS OF FORMING NANO STRUCTURE AND METHODS OF FORMING SOLAR CELL USING THE SAME

CROSS-REFERENCE TO RELATED APPLICATIONS

This U.S. non-provisional patent application claims priorities under 35 U.S.C. §119 of Korean Patent Application Nos. 10-2009-0112665, filed on Nov. 20, 2009 and 10-2010-0005615, filed on Jan. 21, 2010, the entire contents of which are hereby incorporated by reference.

BACKGROUND

The present invention herein relates to methods of forming a nano structure and methods of forming solar cell using the same.

Due to the depletion of fossil energy, researches on alternative energies are actively being performed. In particular, researches on the alternative energies using natural phenomenon which is not depleted, for example, using sun's ray, wind and the like are in the limelight.

As one of alternative energies using the sun's ray, a solar cell is well known. The solar cell is a cell generating an electrical energy by using light energy emitted from the sun, and is in the limelight in that the energy source thereof is not depleted and the sun's light is an environment-friendly energy.

SUMMARY

The present invention provides methods of forming a nano structure the characteristics of which can be easily controlled and methods of forming solar cell using the same.

The present invention also provides methods of forming a nano structure the characteristics of which are enhanced and methods of forming solar cell using the same.

Embodiments of the present invention provide methods of forming a nano structure including: preparing a template; ionizing a surface of the template; forming an oxide layer enclosing the template on the surface of the template; and removing the template.

In some embodiments, the template may include an organic polymer or an organic copolymer.

In other embodiment, the template may include polystyrene.

In still other embodiments, the ionizing of the surface of the template may include substituting residues on the surface of the template with anion groups.

In even embodiments, the anion group may include at least one selected from the group consisting of a sulfuric acid group, a hydroxyl group, a carboxyl group and an acetic acid group.

In yet embodiments, the oxide layer may include at least one selected from the group consisting of zinc oxide, titanium oxide and tin oxide.

In further embodiments, the preparing of the template and the ionizing of the surface of the template may include: forming a first solution by dissolving monomers and a cross-linker in a solvent; and adding a polymerization initiator to the first solution. The polymerization may include a compound including a metallic cation and a nonmetallic anion.

In still further embodiments, the above method may further include adding a pH controller to the first solution. For example, the pH controller may include sodium tetraborate.

In even further embodiments, the forming of the oxide layer may include: dissolving an oxide precursor in an organic solvent to form a second solution; and adding the first solution to the second solution.

In yet further embodiments of the present invention, methods of forming a solar cell, include: forming a first electrode on a first substrate; forming a second substrate and a second electrode corresponding to the first substrate and the first electrode; forming an oxide layer including nano structures and pigments between the first electrode and the second electrode; and forming an electrolyte layer between the oxide layer and the second electrode. The forming of the oxide layer may include: preparing a template; ionizing a surface of the template; forming an oxide layer enclosing the template on the surface of the template; and removing the template.

In other embodiments, the above method may further include forming a catalyst layer between the electrolyte layer and the second electrode.

In still other embodiments, the template may include a polymer or a copolymer.

In even other embodiments, the template may include polystyrene.

In yet other embodiments, the ionizing of the surface of the template may include bonding anion groups on the surface of the template.

In further embodiments, the oxide layer may include cation groups. The oxide layer may be formed on the surface of the template by a bonding between the cation group and the anion groups on the surface of the template.

In still further embodiments, the anion group may include at least one selected from the group consisting of a sulfuric acid group, a hydroxyl group, a carboxyl group and an acetic acid group.

In even further embodiments, the second electrode and the first electrode may include at least one selected from the group consisting of fluorine-tin-oxide (FTO), cadmium-tin-oxide (CTO), and indium-tin-oxide (ITO).

In some embodiments, the nano structures may have a diameter ranged from about 200 nm to about 800 nm.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1 is a flowchart for describing a method of forming a nano structure according to an embodiment of the present invention;

DETAILED DESCRIPTION OF THE EMBODIMENTS

Figure 2A:
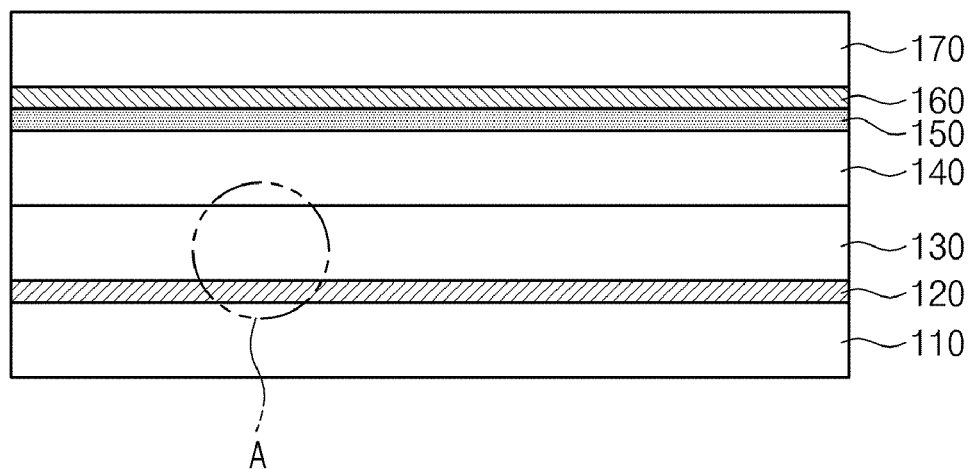
FIGS. 2A through 2C are schematic sectional views illustrating a method of forming a solar cell according to an embodiment of the present invention.

Hereinafter, methods of forming a nano structure and methods of forming solar cell using the same according to exemplary embodiments of the inventive concept will be described with reference to the accompanying drawings. The embodiments described below are provided so that the spirit of the invention may be easily understood by those skilled in the art, and the invention is not limited to the embodiments. The embodiments of the invention may be modified in many different forms within the technical spirit and scope of the present invention. The term 'and/or' includes any and all combinations of one or more of the associated listed items. It will be understood that when an element is referred to as being "on" another element, it can be directly on the other element or intervening elements may also be present. It will be also understood that although the terms 'first' and 'second' are used herein to describe various elements, these terms are used for clarity of description and these elements should not be limited by these terms. In the figures, the dimensions of layers and regions are exaggerated for clarity of illustration.

<Methods of Forming a Nano Structure>

Hereinafter, a method of forming a nano structure according to an embodiment of the inventive concept.

Referring to FIG. 1, in operation S1, a template for forming a nano structure is prepared. The template may include a polymer or copolymer. The template may include an organic polymer or organic copolymer. For example, the template may include polystyrene or poly methyl methacrylate. In an embodiment, the template may be a nonpolar organic polymer.

The preparing of the template may include forming polymer or copolymer using monomers. The forming of the polymer or copolymer using monomers may include dissolving the monomers in an organic solvent, and adding a cross-linker to a template solution in which the monomers are dissolved. In the case where the template is polystyrene, the monomers may be styrene monomers and the cross-linker may be divinyl benzene, but the present invention is not limited thereto. In an embodiment, 250 ml distilled water is used as the solvent of the template solution and about 20 g styrene monomers are used.

The size and shape of the template formed may be easily adjusted according to the percent of the monomers and the cross-linker For example, when the cross-linker is added by a relatively small amount, the template is formed in a small size, whereas when the cross-linker is added by a relatively large amount, the template may be formed in a relatively large size. In an embodiment, the template may be formed in a sphere shape.

A surfactant may be further added to the template solution. In an embodiment, sodium dodecyl sulfate may be added as the surfactant.

A pH controller may be further added to the template solution. The pH controller may be added to the template solution after the template solution is heated to a predetermined temperature. The pH controller may control pH in the template solution so that pH of the template solution may stably store an ionized template solution to be described later. For example, in the case where the template is anionized, the pH controller may control pH in the template solution so that the template solution maintains alkalinity. In an embodiment, sodium tetraborate may be used as the pH controller.

In operation S2, the template in the template solution may be ionized. For ionization of the template, a polymerization initiator including a nonmetallic anion group may be added to the template solution. The polymerization initiator may be a compound which a nonmetallic anion group is bonded to a metallic cation. The nonmetallic anion group may be at least one selected from various nonmetallic anion groups including sulfuric acid group ($So_4^-$), hydroxyl group ($OH^-$), carboxyl group ($COOH^-$) and acetic acid group ($CH_3COOH^-$). For example, potassium persulfate may be used as the polymerization initiator. The ionized template may be formed by residues exposed on a surface of the template, for example, hydrogen groups, being substituted with the nonmetallic anion groups of the polymerization initiator.

The substitution may occur concurrently with the forming of the template. That is, the forming of the template and the ionization of the template may occur in the template solution at the same time. Unlike this, after the forming reaction of the template is completed, a reaction for the ionization may be performed. The ionized template may exist in a state dispersed in the template solution. For example, the template solution including the ionized template may be a colloid solution.

In operation S3, oxide precursor is attached on the surface of the ionized template. By the attachment of the oxide precursor, an oxide layer enclosing the template may be formed. The oxide precursor may be a compound for providing an oxide semiconductor. The oxide precursor may include at least one selected from the group consisting of zinc oxide, titanium oxide and tin oxide. In an embodiment, zinc acetate dehydrate [$Zn(CH_3COO)_2.2H_2O$] may be used as the oxide precursor. The oxide precursor may be selected variously according to the field to which a nano structure formed by the oxide precursor is applied.

The attaching of the oxide precursor on the surface of the ionized template may include dissolving the oxide precursor in a solvent, for example, methanol to form a precursor solution, and adding the template solution to the precursor solution. In an embodiment, the oxide precursor is dissolved by the solvent and then may exist in the precursor solution in the form of a metal ion complex. The metal ion complex may show a positively charged state. For example, in the case where zinc acetate dehydrate is used as the oxide precursor, the oxide precursor may exist in the precursor solution in a state that unit structures of the oxide precursor, i.e., [$ZN_5(OH)_8(H_2O)_2$]$^{2+}$ are bonded by the acetate anion.

A mixing solution of the template solution and the precursor solution is refluxed while being stirred for a predetermined time, for example, for 14 hours to 24 hours. By doing so, the oxide precursor is attached on the surface of the ionized template, so that an oxide layer grows on the surface of the template.

The thickness of the oxide layer grown on the surface of the template may be determined by the concentration of the oxide precursor. For example, in the case where the concentration of the oxide precursor is high, since more oxide precursors approach the surface of the ionized template, a thicker oxide layer may be formed on the surface of the template. Since the thickness of the oxide layer is easily controlled by the concentration of the oxide precursor, the oxide layer can be easily obtained at a desired thickness. In addition, as described above, since the size of the template may be easily controlled by the concentration of the cross-linker and monomers, the size of the nano structure formed by the oxide layer can be controlled more easily. For example, in the case where the nano structure is applied to a solar cell, the nano structure may be formed at a diameter ranged from 200 nm to 800 nm The size of the nano structure is controlled by the size of the template and the concentration of the oxide precursor.

According to the embodiments of the invention, since the template has an ionized surface, the oxide precursor may be selectively attached on the surface of the template. In an embodiment, the template may have a negatively ionized surface. By the ionized surface of the template, the positively charged metal ion complex may be easily attached on the surface of the template. Also, by an electrical attractive force between the negatively ionized surface and the metal ion complex, the unit structures in the oxide layer may be interconnected. Therefore, the oxide layer may be easily grown on the surface of the template.

Thereafter, the mixing solution is cooled and then the template including the oxide layer is filtered. The cooling and filtering may include cooling the mixing solution, centrifugally separating the cooled mixing solution, and rinsing the mixing solution. The mixing solution may be rinsed by using an organic solvent. The cooling and filtering may be repeated several times. In an embodiment, the mixing solution may be cooled at about 4° C. and may be centrifugally separated for about 30 minutes. Ethanol is used for rinsing the mixing solution. The template including the oxide layer cooled and filtered may be dispersed in an organic solvent.

Thereafter, the template on which the oxide precursor is attached is annealed to thus form an oxide nano structure. In operation S4, the template may be removed by the annealing. The annealing may be performed by annealing only the template including the oxide layer or coating the template including the oxide layer on another element, for example, a substrate, and then annealing the substrate.

<Methods of Forming Solar Cell Including a Nano Structure>

A method of forming a solar cell will be described with reference to FIGS. 2A through 2C and FIG. 3. FIG. 2A shows a solar cell according to an embodiment of the present invention, and FIG. 3 is a detailed view of region A of FIG. 2A.

Figure 2B:
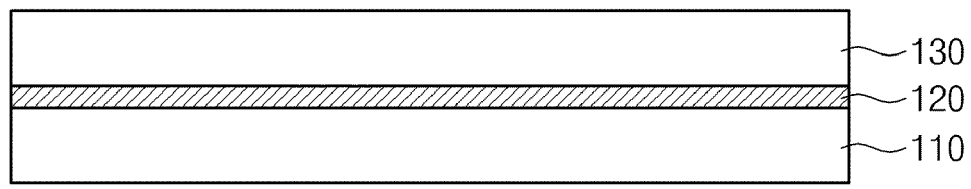
Figure 3:
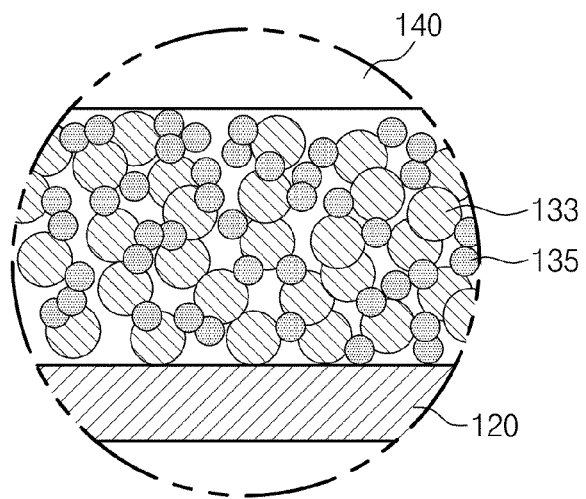
FIG. 3 is a detailed view of portion A of FIG. 2A.

Referring to FIG. 2B, a first electrode 120 is formed on the first substrate 110. The first substrate 110 may be at least one selected from a variety of transparent substrates including a glass substrate. Unlike this, the first substrate 110 may be an opaque substrate. The first electrode 120 may be formed by coating a conductive material. The first electrode 120 may include at least one selected from a variety of conductive materials including fluorine-tin-oxide (FTO), cadmium-tin-oxide (CTO), and indium-tin-oxide (ITO).

An oxide layer 130 is formed on the first electrode layer 120. The oxide layer 130 may include an oxide nano structure 133 and pigments 135. The forming of the oxide layer 130 may include depositing the oxide nano structures 133 on the first electrode 120, and depositing the pigments 135.

The oxide nano structures 133 may be formed on the first electrode 120 by coating the solution in which the template including the oxide layer is dispersed on the first electrode 120, and annealing the first substrate 120. The annealing may be performed at about 500° C. for about 2 hours. By the annealing, the template is removed, so that the oxide nano structures 133 may be selectively left on the first electrode 120. By the methods of forming the nano structures 133 according to the embodiments of the present invention, the size of the oxide nano structures 133 can be easily controlled. Therefore, the nano structures 133 having the size having a high light efficiency can be easily formed. In an embodiment, the nano structures 133 in the oxide layer 130 may have a diameter ranged from about 200 nm to about 800 nm.

Figure 2C:
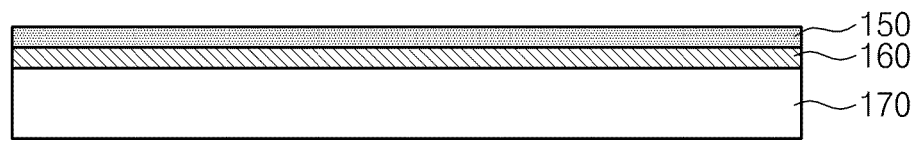

Referring to FIG. 2C, a second substrate 170 and a second electrode 160 corresponding to the first substrate 110 and the first electrode 120 are prepared. The second substrate 170 may be at least one selected from a variety of transparent substrates including a glass substrate. The second electrode 160 may be formed on the second substrate 170 by coating a conductive material on the second substrate 170. The second electrode 160 may be, for example, a conductive transparent electrode.

A catalyst layer 150 may be formed on the second electrode 160. The catalyst layer 150 may be a layer for accelerating a reduction process in an electrolyte layer 150. In an embodiment, the electrolyte layer 150 may include platinum (Pt).

Referring to FIG. 2A, the first substrate 110 and the second substrate 170 may be disposed such that the first electrode 120 faces the second electrode 160. The electrolyte layer 140 is formed between the first substrate 110 and the second substrate 170. The electrolyte layer 140 may fill spaces between the nano structures 133 and the pigments 135. The sequence of forming the electrolyte layer 140 may be changed according to the phase of the electrolyte layer 140. The electrolyte layer 140 may have one phase selected from the group consisting of liquid phase, solid phase and gel. In an embodiment, the electrolyte layer 140 may include $I_2^-/I^-$ based electrolyte.

Figure 4:
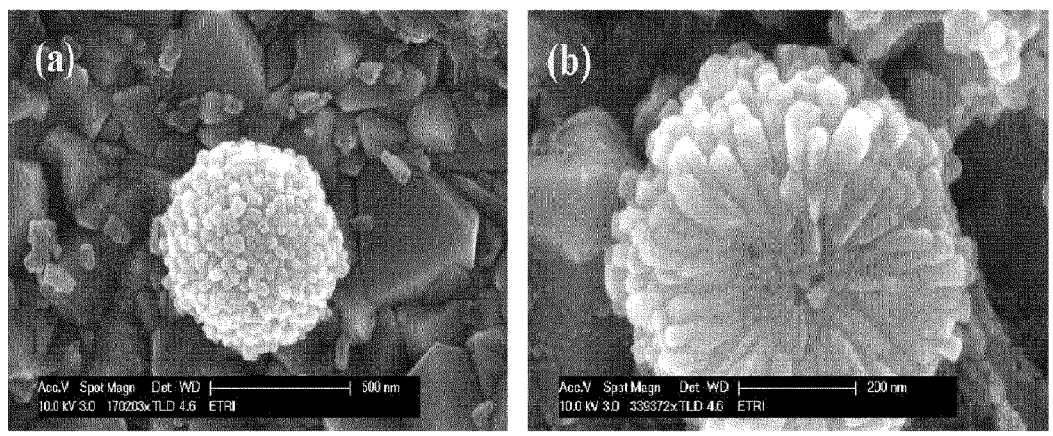
FIG. 4 is electron microscopy photographs showing nano structures formed by the embodiments of the present invention.

Effects according to the embodiments of the present invention will be described with reference to FIG. 4. FIG. 4 is photographs of a zinc oxide nano structure formed according to the embodiments of the present invention. The zinc oxide nano structure was formed by using polystyrene the surface of which is ionized by using sulfuric acid group, and zinc acetate dehydrate [$Zn(CH_3COO)_2 \cdot 2H_2O$] was used as the oxide precursor. Referring to FIG. 4, it can be seen that the nano structure has been grown such that the unit structures in the nano structure are interconnected.

The methods of forming an oxide nano structure according to the embodiments of the present invention include forming an oxide precursor layer on an ionized surface of a template. Since the oxide precursor layer is formed on the ionized surface of the template, the oxide precursor can be efficiently formed on the surface of the template.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a solar cell, comprising:
forming a first electrode on a first substrate;
forming a second substrate and a second electrode corresponding to the first substrate and the first electrode;
forming an oxide layer including nano structures and pigments between the first electrode and the second electrode, the oxide layer having cation groups; and
forming an electrolyte layer between the oxide layer and the second electrode,
wherein the forming of the oxide layer includes:
preparing a template;
ionizing a surface of the template to form bonding anion groups thereon;
forming an oxide layer enclosing the template on the surface of the template, by a bonding between the cation groups and the anion groups; and
removing the template.

2. The method of claim 1, further comprising forming a catalyst layer between the electrolyte layer and the second electrode.

3. The method of claim 1, wherein the template has a polymer or a copolymer.

4. The method of claim 3, wherein the template has polystyrene.

5. The method of claim 1, wherein the oxide layer has at least one selected from the group consisting of zinc oxide, titanium oxide and tin oxide.

6. The method of claim 1, wherein the anion group has at least one selected from the group consisting of a sulfuric acid group, a hydroxyl group, a carboxyl group and an acetic acid group.

7. The method of claim 1, wherein the second electrode and the first electrode have at least one selected from the group consisting of fluorine-tin-oxide (FTO), cadmium-tin-oxide (CTO), and indium-tin-oxide (ITO).

8. The method of claim 1, wherein the nano structures have a diameter ranged from about 200 nm to about 800 nm.

* * * * *